US008832009B2

(12) United States Patent
Rose et al.

(10) Patent No.: US 8,832,009 B2
(45) Date of Patent: Sep. 9, 2014

(54) ELECTRONIC CHARGE SHARING CMOS-MEMRISTOR NEURAL CIRCUIT

(75) Inventors: Garrett S. Rose, Clinton, NY (US); Robinson E. Pino, Potomac, MD (US); Qing Wu, Manlius, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 294 days.

(21) Appl. No.: 13/506,856

(22) Filed: May 15, 2012

(65) Prior Publication Data

US 2013/0311413 A1     Nov. 21, 2013

(51) Int. Cl.
*G06N 3/08* (2006.01)
(52) U.S. Cl.
USPC .................................. 706/25; 706/15; 706/33
(58) Field of Classification Search
None
See application file for complete search history.

(56) References Cited

U.S. PATENT DOCUMENTS

| | | | | |
|---|---|---|---|---|
| 5,222,193 A | * | 6/1993 | Brooks et al. | 706/25 |
| 5,621,336 A | * | 4/1997 | Shibata et al. | 326/36 |
| 5,818,081 A | * | 10/1998 | Ohmi et al. | 257/319 |
| 6,844,582 B2 | * | 1/2005 | Morita et al. | 257/295 |
| 2011/0106742 A1 | * | 5/2011 | Pino | 706/33 |
| 2012/0150781 A1 | * | 6/2012 | Arthur et al. | 706/35 |

OTHER PUBLICATIONS

"A Lower-Power Memristive Neuromorphic Circuit Utilizing a Global/Local Training Mechanism" Garrett S. Rose, Robinson Pino, Qing Wu, Neural Networks (IJCNN), The 2011 International Joint Conference on Jul. 31-Aug. 5, 2011, pp. 2080-2086.*

* cited by examiner

*Primary Examiner* — Kakali Chaki
*Assistant Examiner* — Mai T Tran
(74) *Attorney, Agent, or Firm* — Joseph A. Mancini

(57) ABSTRACT

CMOS-memristor circuit is constructed to behave as a trainable artificial synapse for neuromorphic hardware systems. The invention relies on the memristance of a memristor at the input side of the device to act as a reconfigurable weight that is adjusted to realize a desired function. The invention relies on charge sharing at the output to enable the summation of signals from multiple synapses at the input node of a neuron circuit, implemented using a CMOS amplifier circuit. The combination of several memristive synapses and a neuron circuit constitute a neuromorphic circuit capable of learning and implementing a multitude of possible functionalities.

11 Claims, 9 Drawing Sheets

| Function | Memristance (MΩ) | | | Energy ($10^{-15}$J) | Transistor count | Delay (us) |
|---|---|---|---|---|---|---|
| | A | B | C | | | |
| ABC | 31 | 31 | 31 | 48.9 | 13 | 103.2 |
| A+B+C | 72 | 72 | 72 | 46.48 | 13 | 279.4 |
| A+BC | 82 | 41 | 41 | 47.9 | 13 | 224.4 |
| AB+AC+BC | 47 | 47 | 47 | 48.27 | 13 | 168.3 |
| AB+AC | 57 | 28.5 | 28.5 | 49.03 | 13 | 257 |

Figure 6

ELECTRONIC CHARGE SHARING CMOS-MEMRISTOR NEURAL CIRCUIT

STATEMENT OF GOVERNMENT INTEREST

The invention described herein may be manufactured and used by or for the Government for governmental purposes without the payment of any royalty thereon.

BACKGROUND OF THE INVENTION

The memristor, or "memory resistor," was first theorized by Leon Chua at the University of California-Berkeley in 1971[1]. Only theoretical for more than 30 years, researchers at Hewlett-Packard recently announced the discovery of memristors fabricated in their lab [2, 3]. In terms of its behavior, a memristor is a device whose resistance changes under given toggle conditions (e.g., exceeding some voltage) and then holds that resistance until another toggle condition is met. In this way, memristors can, be thought of as reconfigurable resistors with memory. However, given the nature at which Chua arrived at this particular switching property, relating charge (q) and flux linkage ($\phi$), the memristor is a new fundamental electronic device in the same way resistors, capacitors and inductors are fundamental.

Memristors are promising devices for a wide range of potential applications from digital memory, logic and analog circuits, and even some bio-medical applications. Of particular interest for the invention described here memristors can also be applied in the development of neural networks. More specifically, memristor behavior is very similar to that of the synapses found in biological neural networks.

OBJECTS AND SUMMARY OF THE INVENTION

Treating nanoscale memristors as artificial synapses it becomes feasible to construct neuromorphic circuits dense enough to realize many applications such as image and voice recognition in hardware. The present invention uses memristors as artificial synapses in conjunction with a CMOS based neuron circuit that can be used in the construction of hybrid CMOS-memristor neuromorphic systems.

It is therefore an object of the present invention to provide an apparatus that behaves as a trainable neuromorphic circuit.

It is a further object of the present invention to provide an apparatus that weights and sums the outputs of a plurality of memristor-based artificial synapses into the input of a, neuron.

It is yet a further object of the present invention to provide an apparatus that trains a neuromorphic circuit through the application of externally-supplied signals.

It is yet still an object of the present invention to detect whether the output of a neuromorphic circuit matches an expected output, and to train said neuromorphic circuit to accomplish the same.

It is yet a further object of the present invention to provide a neuromorphic circuit that functions as a logic gate.

Briefly stated, the present invention provides an apparatus comprising a CMOS-memristor circuit which is constructed to behave as a trainable artificial synapse for neuromorphic hardware systems. The invention relies on the memristance of a memristor at the input side of the device to act as a reconfigurable weight that is adjusted to realize a desired function. The invention relies on charge sharing at the output to enable the summation of signals from multiple synapses at the input node of a neuron circuit, implemented using a CMOS amplifier circuit. The combination of several memristive synapses and a neuron circuit constitute a neuromorphic circuit capable of learning and implementing a multitude of possible functionalities.

INCORPORATED BY REFERENCE

[1] L. O. Chua, "Memristor—the missing circuit element," IEEE Trans. on Circuit Theory, vol. CT-18, no. 5, pp. 507-519, September 1971.

[2] D. B. Strukov, G. S. Snider, D. R. Stewart, and R. S. Williams, "The missing memristor found," Nature, vol. 453, pp. 80-83, May 2008.

[3] R. S. Williams, "How we found the missing memristor," IEEE Spectrum, vol. 45, no. 12, pp. 28-35, December 2008.

[4] J. Stine, I. Castellanos, M. Wood, J. Henson, F. Love, W. R. Davis, P. D. Franzon, M. Bucher, S. Basavarajaiah, J. Oh, and R. Jenkal, "FreePDK: An Open-Source Variation-Aware Design Kit," in *Proceedings of the 2007 IEEE International Conference on Microelectronic Systems Education*, 2007.

[5] R. E. Pino, J. W. Bohl, N. McDonald, B. Wysocki, P. Rozwood, A. Campbell, A, Oblea, and A. Timilsina, "Compact method for modeling and simulation of memristor devices," in *Proceedings of IEEE/ACM International Symposium on Nanoscale Architectures*, June 2010.

[6] G. S. Rose, R. Pino, and Q. Wu, "A Low-Power Memristive Neuromorphic Circuit Utilizing a Global/Local Training Mechanism," in *Proceedings of International Joint Conference on Neural Networks*, San Jose, Calif., August 2011.

BRIEF DESCRIPTION OF THE DRAWINGS

FIG. 6 depicts the energy and delay for charge sharing neurons configured for Boolean logic.

DETAILED DESCRIPTION OF THE PREFERRED EMBODIMENT

The present invention, an artificial neural circuit is constructed where memristors determine the weights of synapses that feed the CMOS based neural circuit.

Figure 1:
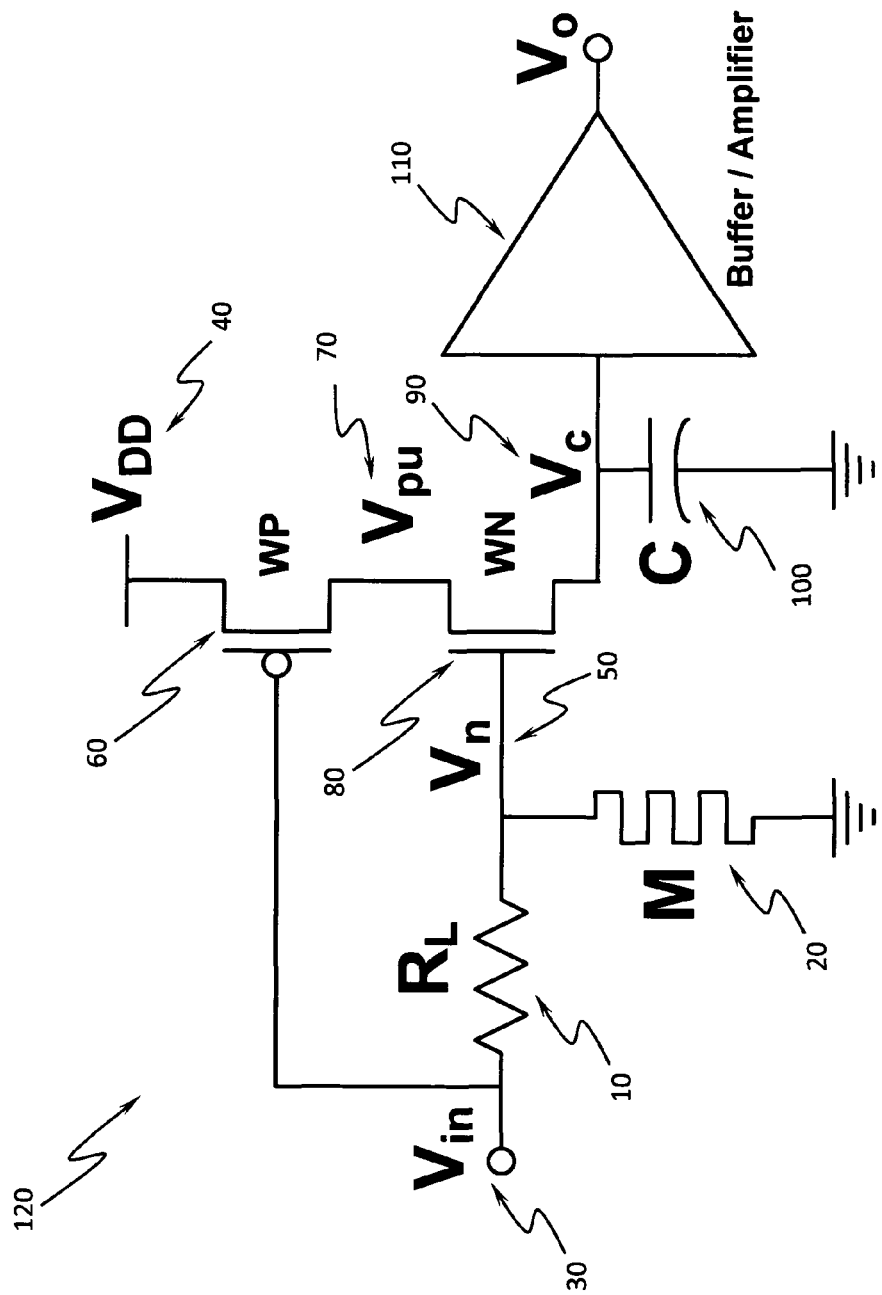
FIG. 1 depicts a CMOS-memristor neural circuit consisting of synaptic circuit (left) and a buffering stage (right) which amplifies the summed result of the synaptic circuits.

Referring to FIG. 1, a CMOS-memristor neural circuit 120, a voltage divider circuit that acts as the memristive synapse. The value for the load resistance $R_L$ 10 (can also be accomplished with a pass transistor) must be properly chosen such that (1) the maximum voltage drop across the memristor never exceeds a toggle or threshold voltage at which the memristor M 20 will begin changing states and (2) the output voltage swing is maximized for the maximum possible change in memristance ($R_{off}$-$R_{on}$), where $R_{off}$ and $R_{on}$ are the maximum and minimum resistance values for the memristor 20, respectively. In other words, it is desired that the output to be very sensitive to the memristance without unintentionally changing the value of the memristance itself.

Still referring to FIG. 1, consider a chalcogenide-material-based memristor 20 where the device memristance swings roughly between 200Ω and 1 kΩ and the threshold for the device to change memristance states is approximately +/−0.2V. For a small input voltage ($V_{in}$) 30, the maximum drop across the memristor 20 will not approach or exceed +/−0.2V so the first criterion is satisfied. This small input voltage 30 can be guaranteed for sub-threshold operation where the supply voltage $V_{DD}$ 40 is held below the threshold voltage of the transistors. Furthermore, if a sub-threshold voltage is used for the supply then the load resistance $R_L$ 10 that maximizes the voltage swing can be determined by $R_L = \sqrt{R_{on} \cdot R_{off}}$.

The CMOS circuitry within the overall neural circuits must perform two major tasks: (1) amplify the voltage swing at voltage node $V_n$ ($\Delta V_n$) 50 and (2) provide an output that can be summed together with the outputs of other synapses. The synaptic circuit shown in FIG. 1 achieves the above mentioned tasks through charge sharing.

Again referring to FIG. 1, the summation circuit functions by allowing the pull-up PMOS transistor WP 60 to charge up the node $V_{pu}$ 70 between the two transistors when the input is 0V. Once charged, $V_{pu}$ 70 is held high until the input goes high which also produces a voltage at $V_n$ 50 (based on the memristance value) and turns on the driving NMOS transistor WN 80. A high input voltage ($V_{in}$) 30 will also turn off the pull-up PMOS transistor WP 60. The charge is then allowed to pass through the driving NMOS transistor WN 80 to increase the voltage $V_c$ 90 across the summation capacitance 100. When $V_n$ 50 is less than the threshold voltage of the driving NMOS transistor WN 80 (high threshold variety) the transistor never turns on very strongly. Normally, the two floating capacitors at each internal node will charge to a common voltage. However, as $V_c$ 90 is charged it approaches the gate voltage $V_n$ 50 which causes the gate to source voltage of the driving NMOS transistor WN 80 to quickly approach zero. If the transistors are sized properly then the driving NMOS transistor WN 80 will turn off before charging is completed. Thus, the amount of charge and the associated voltage $V_c$ 90 is weighted according to the total memristance values M 20 at all inputs.

Still with reference to FIG. 1, the value of the resistance $R_L$ 10 could be set to 477Ω The next design parameter is the voltage supply $V_{DD}$ 40 which is set to help maximize $\Delta V_n$. For the earlier example, $V_{DD}$ 40 can be set to 250 mV for 45 nm CMOS which also forces the circuit into sub-threshold operation. This leaves the sizing of the driving NMOS WN 80 and pull-up PMOS WP 60 transistors in the synapse circuit. The size of the pull-up PMOS transistor WP 60 should be tuned to (1) react quickly to changes at the input $V_{in}$ 30 and (2) provide enough internal capacitance at its drain to match the summation capacitance 100 at $V_c$ 90 and promote charge sharing. Assuming the drain capacitance of a transistor is approximately equal to the gate capacitance, the transistor width sizing of WP 60 should be equal to the total size of all input gates of the neuronal buffer or amplifier circuit 110.

Turning to the buffering side of the circuit, it is important that the amplifier 110 be sensitive to changes at $V_c$ 90. Furthermore, the output of buffer or amplifier circuit should be pulled strongly to either $V_{DD}$ 40 or ground depending on the input. Several options are possible for the buffer or amplifier circuit including a chain of CMOS inverters or a CMOS operational amplifier.

The final design parameter for the synaptic circuit 120 is the width of the driving NMOS transistor WN 80 in FIG. 1.

Figure 2:
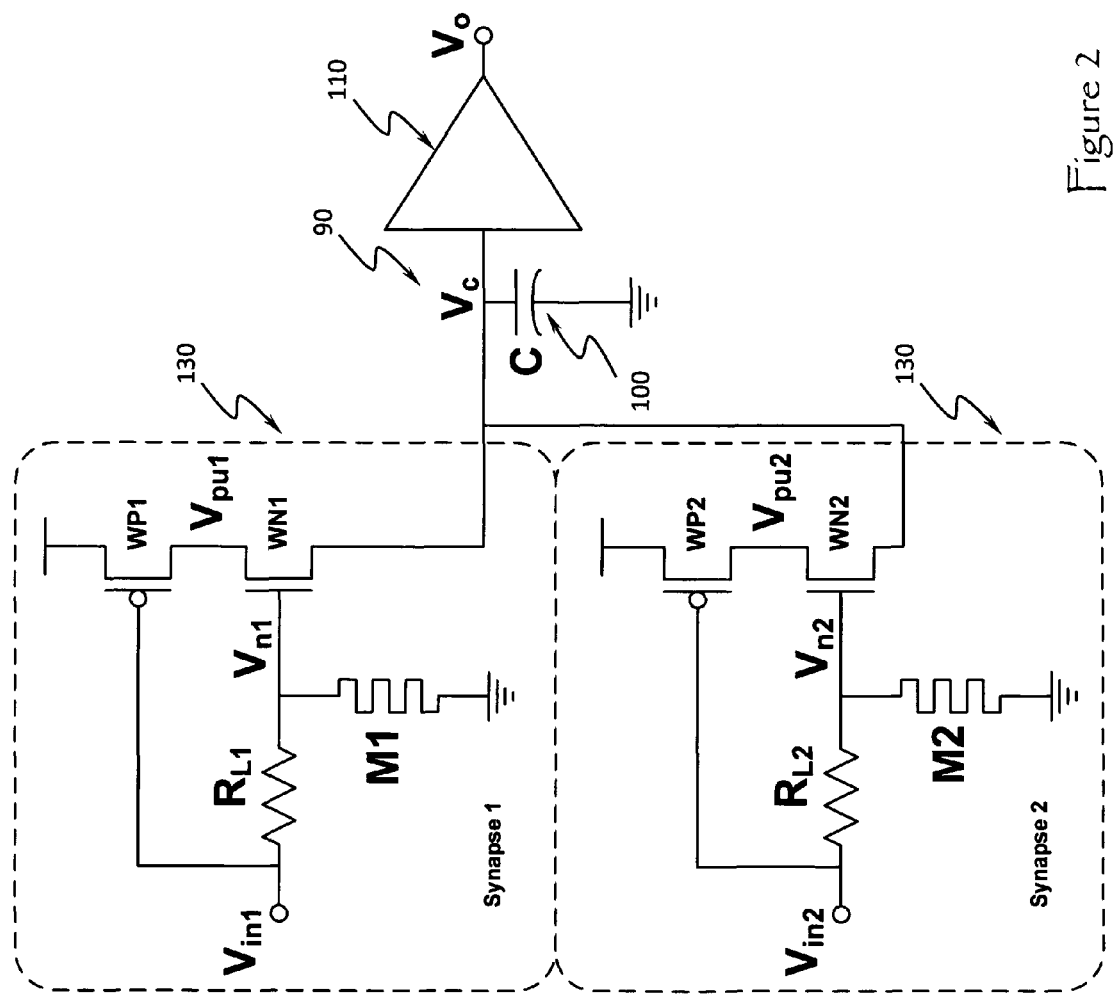
FIG. 2 depicts a schematic of two memristive synapse circuits driving a common CMOS neuron. The total charge from both inputs is summed at node $V_c$ and amplified at output $V_o$.
Figure 3:
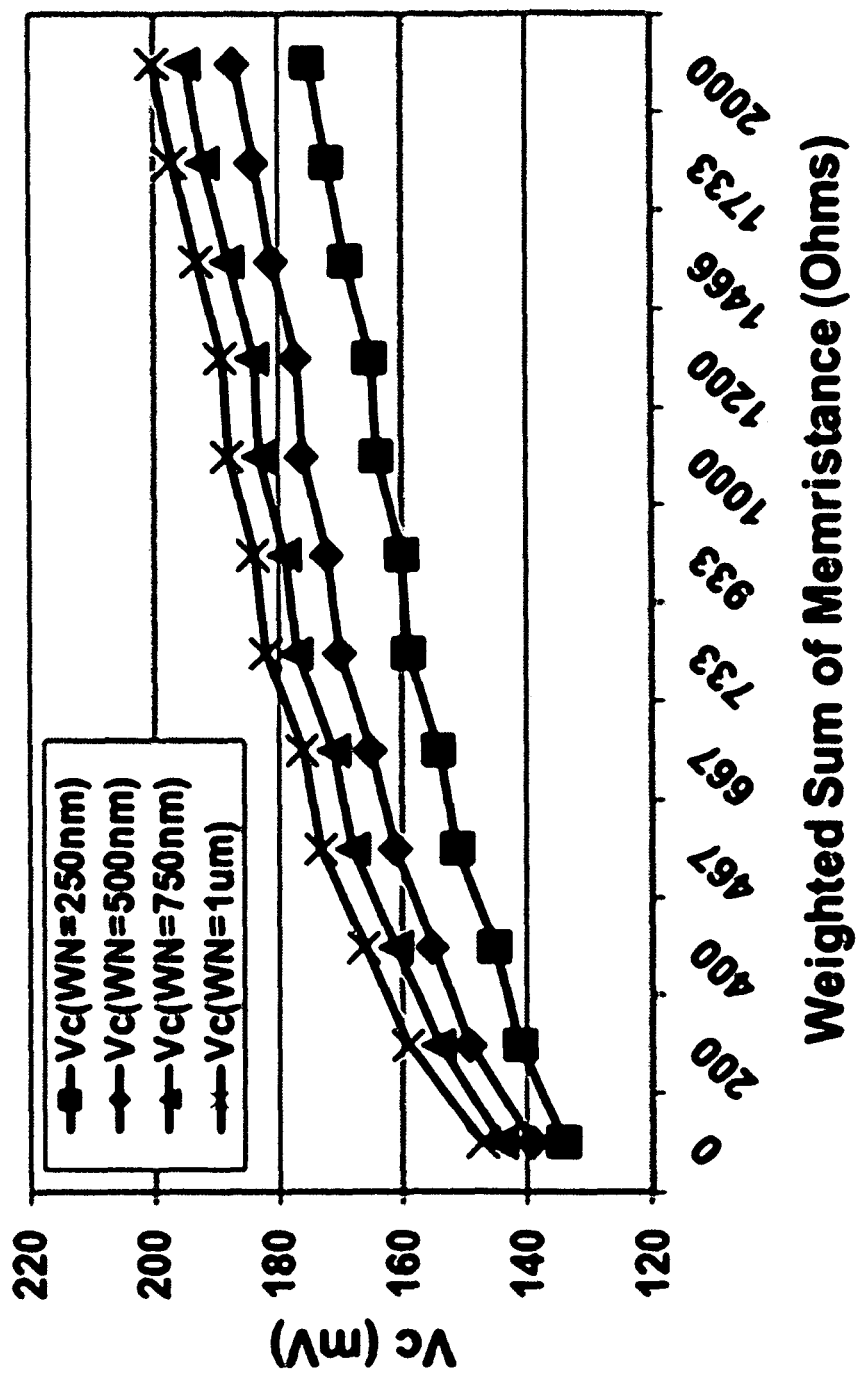
FIG. 3 depicts the voltage output of the synapses ($V_c$) as a function of the weighted sum of the inputs, considering a two-input gate (see FIG. 2). Here a high voltage input of 250 mV is logic '1' and a low voltage, 0V, is '0'. Each weighted input is the product of each logic value (0 or 1) and the respective memristance. The weighted inputs are then summed to obtain the weighted sum of memristance.

Referring to FIG. 2, considering the earlier example and the case where two synaptic circuits 130 drive a common summation capacitance 100, FIG. 3 shows a plot of voltage $V_c$ (see FIG. 1, 90) versus the weighted sum of the inputs and for a variety of width values for the driving NMOS transistor WN. (see FIG. 1, 80) To clarify, the weighted sum is determined by multiplying the logic value at each input (e.g., '1' for 250 mV and '0' for 0V) by the corresponding memristance value M (see FIG. 1, 20). The results in FIG. 3 were taken for a two input neural circuit, i.e., two synapses driving a single buffering circuit at node V 90 such that the weighted sum is the sum of the memristors driven by a high voltage. For example, if both inputs were 250 mV (logic '1') and $M_1$=1000Ω while $M_2$=200Ω then the weighted sum would be 1200Ω. This being the case, the desired response is for $V_c$ 90 to be linear as a function of weighted sum of the inputs such that $V_c$ 90 reflects that summation. A further desire would be to have the $V_c$ 90 response centered around 125 mV (or half $V_{DD}$) to help reduce the required size of the first amplification stage.

Figure 4:
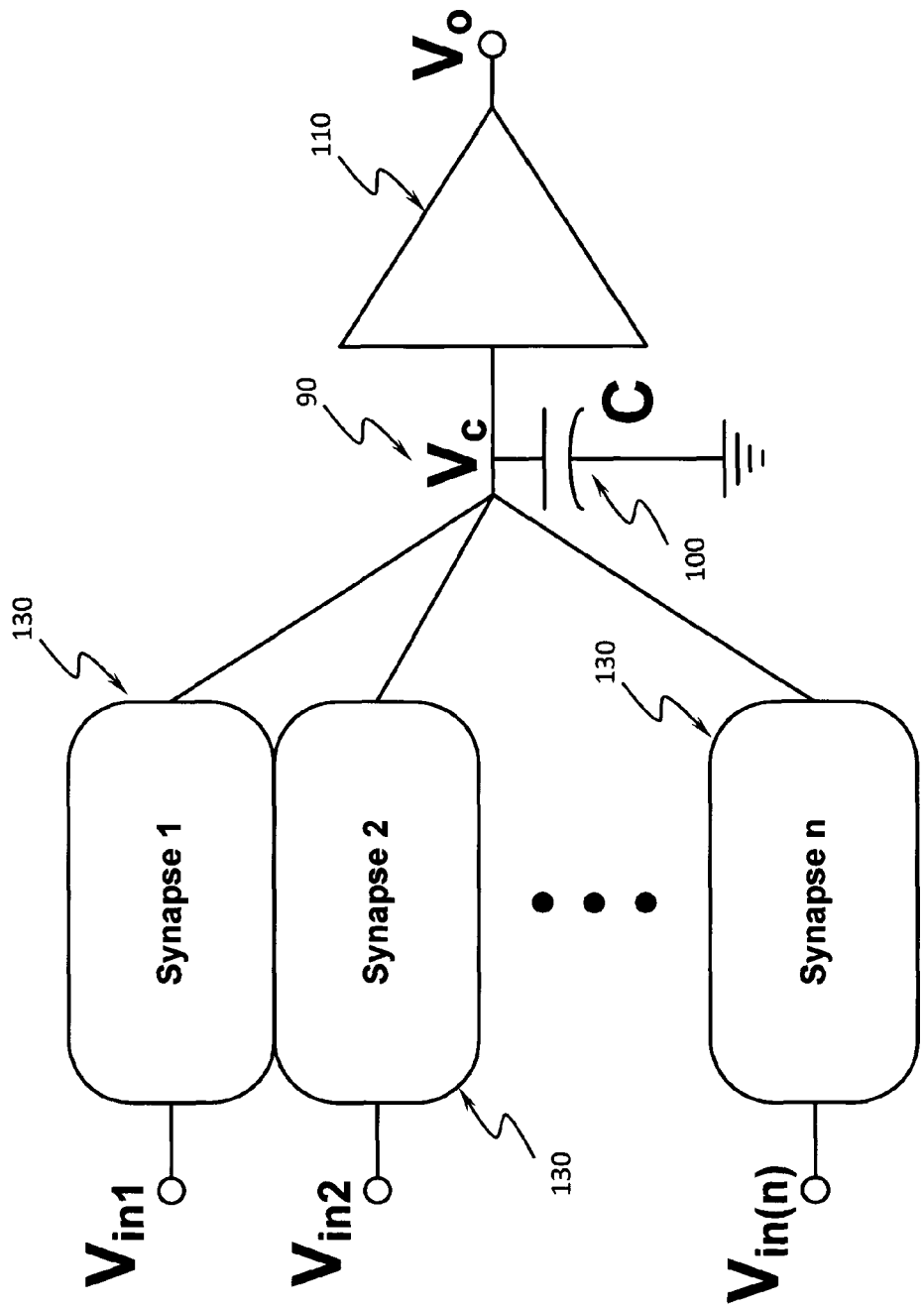
FIG. 4 depicts a schematic of n memristive synapse circuits driving a common CMOS neuron. Each "Synapse n" block contains the same memristive synapse circuits shown in FIG. 1 and FIG. 2. The total charge from all inputs is summed at node $V_c$ and amplified at output $V_o$.

Referring to FIG. 4 provides an example of how multiple synaptic circuits 130 can be connected and then buffered to produce an amplified version of the weighted sum of the inputs. As can be seen in FIG. 4, the circuit consists of n synaptic inputs all driving node $V_c$ 90. For example, considering how the inputs are weighed the total logically weighted sum would range from 0Ω to n·(1000Ω), if the memristance value for $R_{off}$ were 1000Ω.

Figure 5:
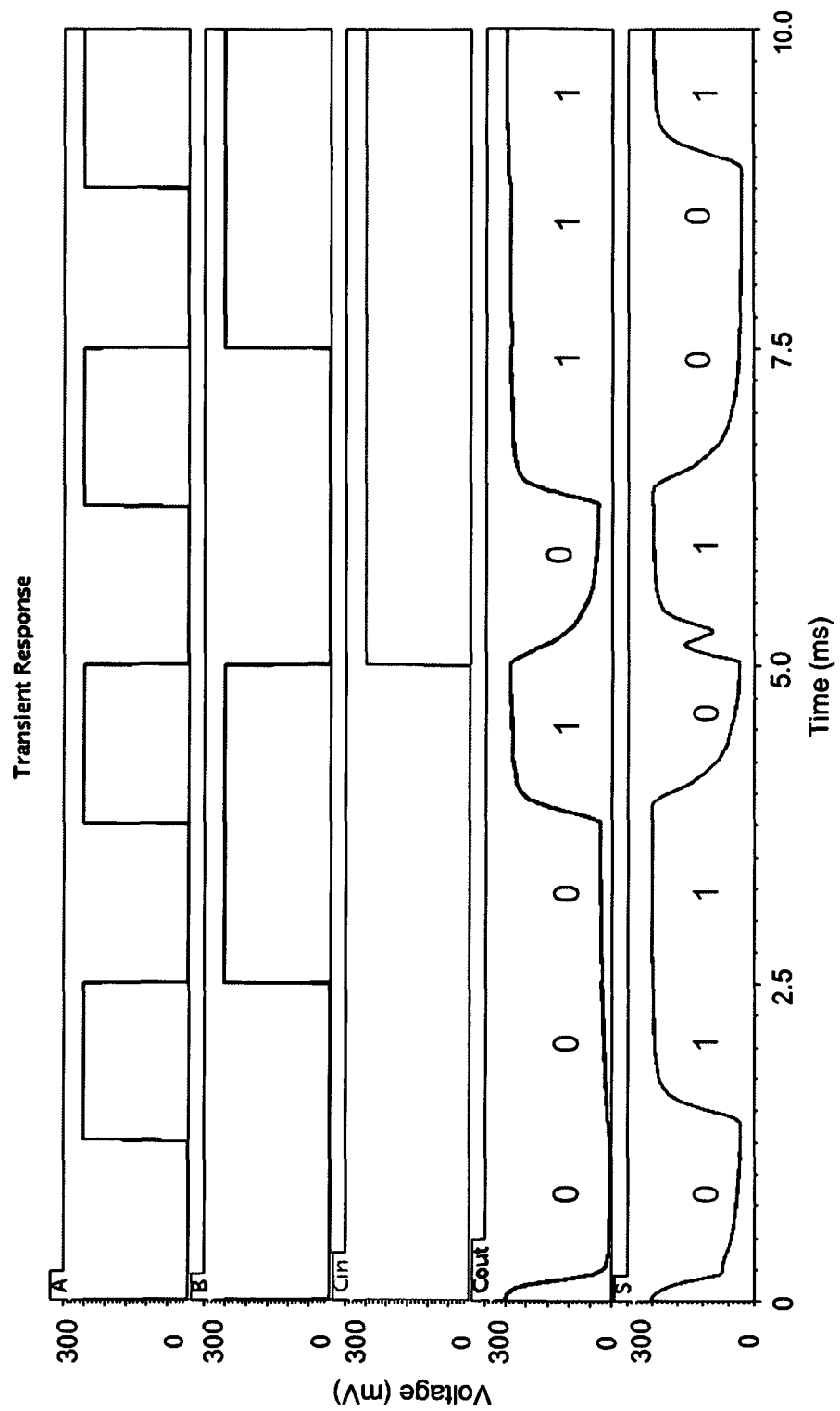
FIG. 5 depicts the simulation results showing the use of three 3-input charge sharing neural circuits in the construction of a full adder.

Referring to FIG. 5 shows simulation results for three 3-input CMOS-memristor neural circuits configured to implement a majority logic full adder described. Specifically, the majority function Maj(A, B, $C_{in}$) of all three inputs A, B and $C_{in}$ is equivalent to the carry out $C_{out}$ term of a full adder. Furthermore, the sum can also be determined from a majority function as Maj(Maj($\overline{A},\overline{B},\overline{C}_{in}$), Maj(A,B,$\overline{C}_{in}$), $C_{out}$) such that only three 3-input CMOS-memristor neural circuits are required to implement a full adder. As can be seen from FIG. 5 the circuit as configured functions as desired.

Considering all transistors to be fabricated using 45 nm CMOS and of the high threshold variety with $V_{DD}$ (see FIG. 1, 40) set to 250 mV the energy consumption of the circuit is very low, on the order of femtojoules (fj) or $10^{-2}$ joules according to SPICE simulation results utilizing the 45 nm predictive design kit (FreePDK) from Oklahoma State University [4] and memristor models developed at the Air Force Research Laboratory [5, 6]. The delay of the circuit is around 500 us.

Referring to FIG. 6 shows the performance of a single 3-input CMOS-memristor neural circuit mapped to implement several Boolean logic functions such as OR and AND functions. In addition to showing the performance, FIG. 6 also illustrates the ability to configure the CMOS-memristor neural circuit to implement a variety of logic functions. While such speeds may be on the order of what is observed for biological neurons, robust and even high performance operation will require massive parallelism.

Figure 7:
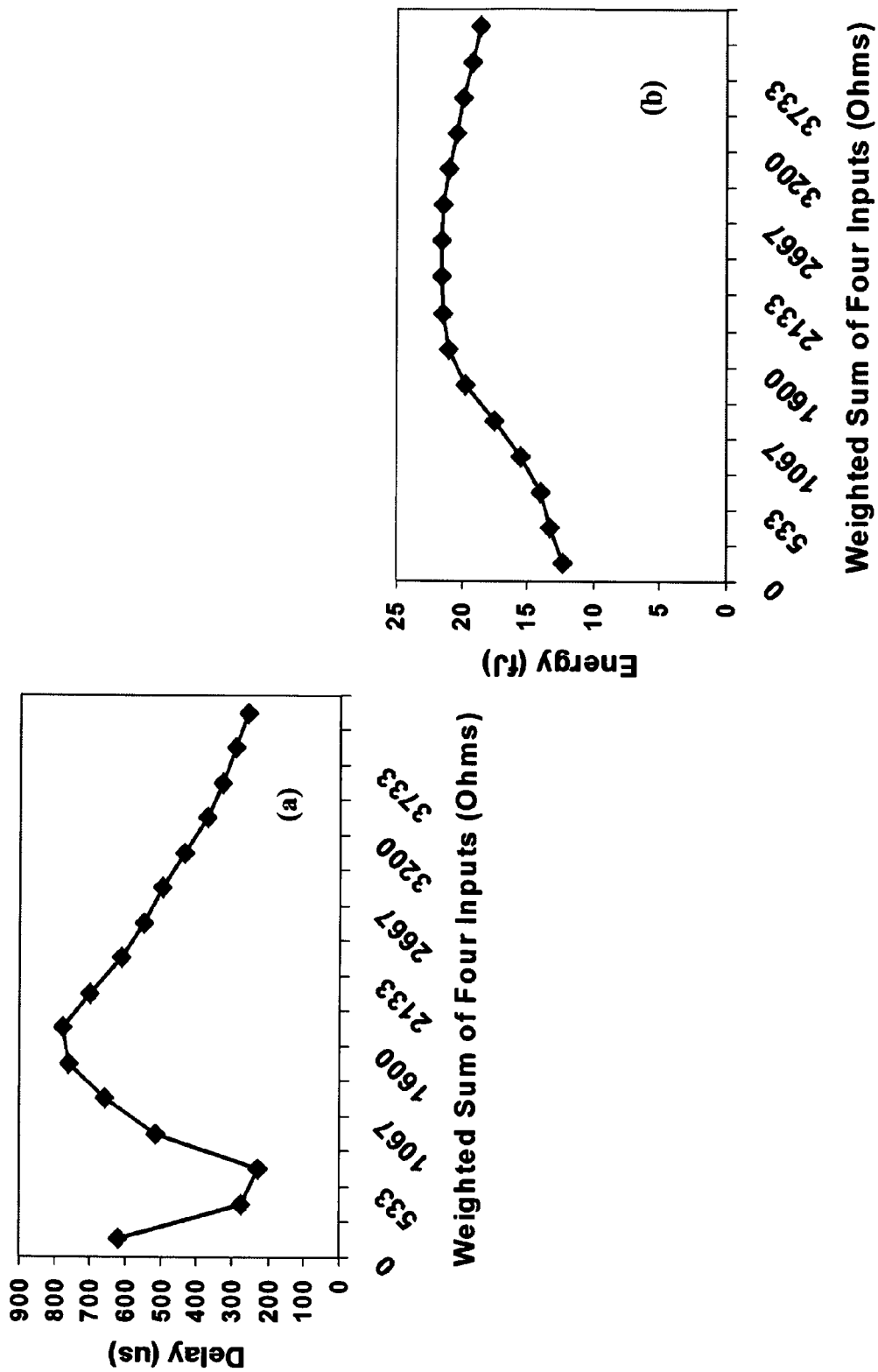
FIG. 7 depicts the delay of a 4-input charge sharing neural circuit and the energy of a 4-input charge sharing neural circuit.

Referring to FIG. 7 shows the delay and energy of the circuit depicted iii FIG. 6 as a function of the weighted sum of the four synaptic inputs.

Figure 8:
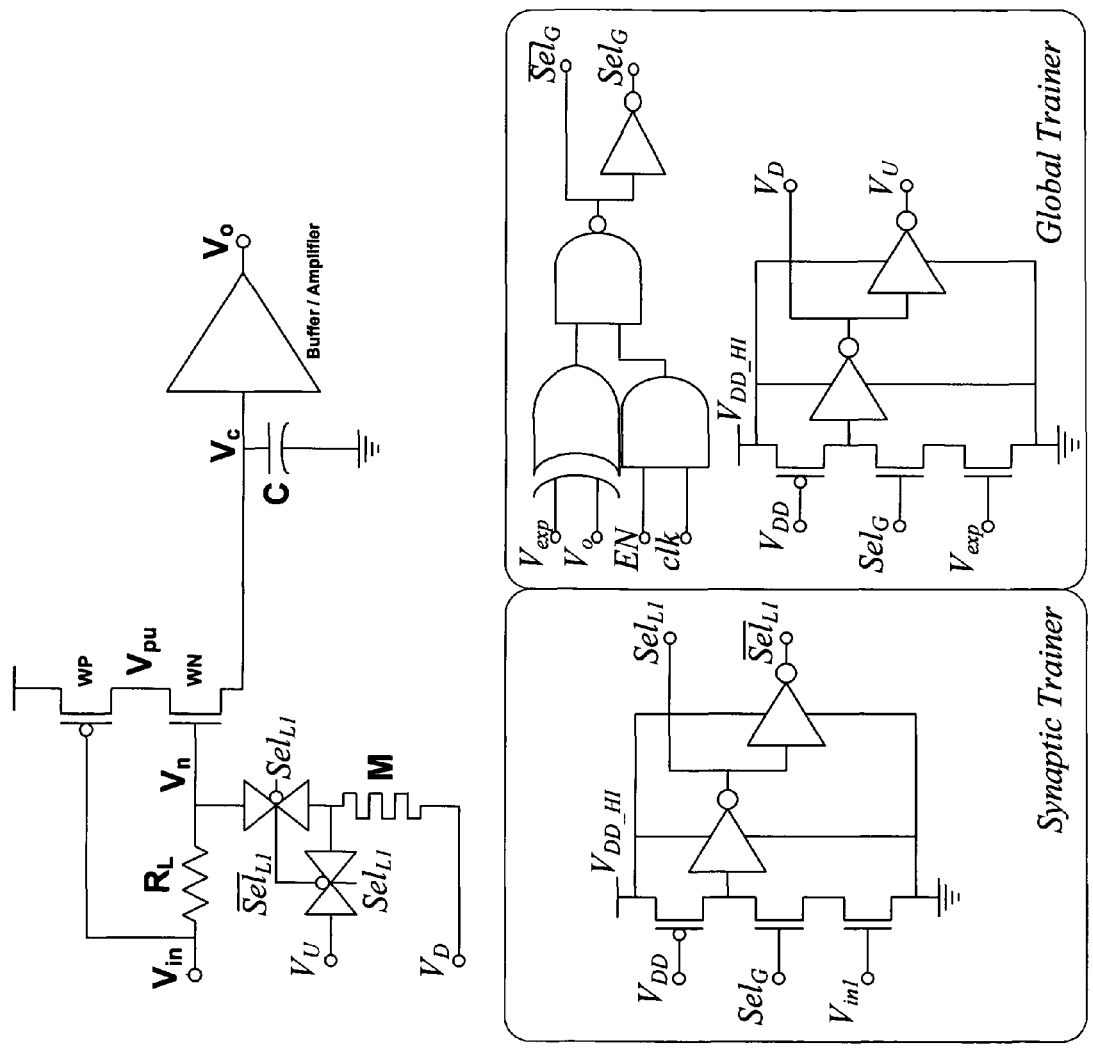
FIG. 8 depicts a single input neural circuit with one memristive synapse and a neuron. Also included is a feedback circuit used to train the memristor for some desired behavior.

Referring to FIG. 8 shows, as an example of training, an implementation of the CMOS-memristor neural circuit 120 from FIG. 1 but with additional circuitry that can be used for learning. The learning circuit used to train the memristors is designed such that circuit behavior eventually matches a given input signal expectation, $V_{exp}$. Note that learning is made possible with two circuits: the global trainer and the local trainer. The global trainer exists for each neuron such that only one global trainer is required for several memristive synapse circuits. The purpose of the global trainer is to detect whether or not the output of the circuit matches some expectation. If the circuit does not produce the expected result, then the global trainer will send a signal ($Sel_G$) to all memristive synapses connecting to that neuron indicating training must occur. A local trainer is implemented for each synapse which takes the $Sel_G$ signal from the global trainer and if both $Sel_G$ and the respective input voltage $V_{in}$ are high then a high voltage training pulse is delivered across the memristor. During training, several clock cycles may be required to test the output and train the memristors to implement a particular function. So long as the memristors can be trained (i.e., they're not stuck on some particular state as a result of device failure) the circuit will eventually be trained to match the expected function regardless of what memristance states are actually used.

Still referring to FIG. 8 also allows training in both directions by controlling the polarity of the voltage drop across the memristor during the training phase. As can be seen in the figure, the memristor device is positioned between two voltages ($V_U$ and $V_D$) while training occurs. If $V_U$ is high and $V_D$ is low then the memristor is trained toward $R_{on}$. On the other hand, if $V_U$ is low and $V_D$ is high then the drop across the memristor is negative and it is trained toward $R_{off}$, the off state. It should also be noted that the signal $V_D$ can be set normally to a low value and acts as the ground rail during normal operation.

Figure 9:
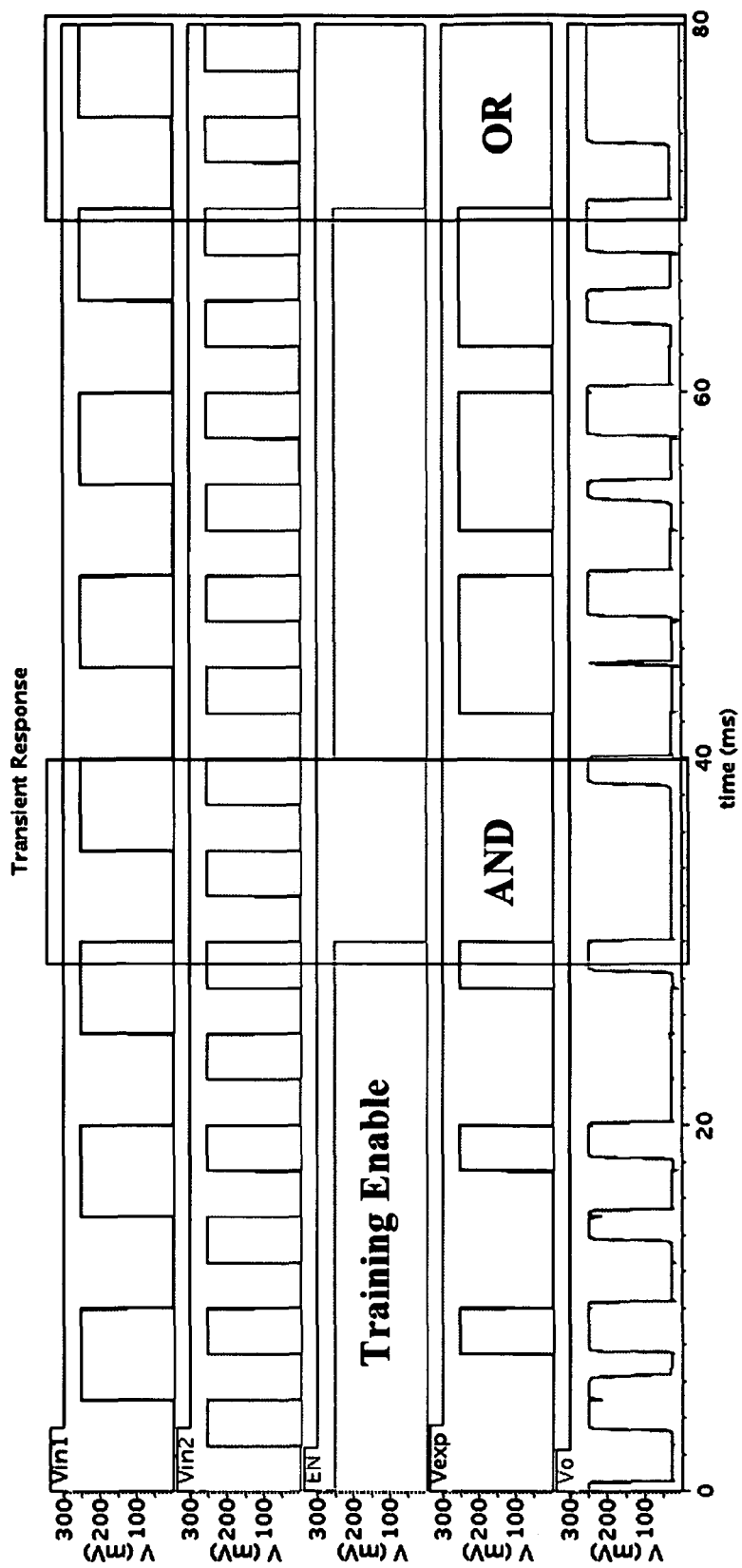
FIG. 9 depicts an example 2-input CMOS-memristor neural circuit (based on FIG. 8) trained as an AND gate and then an OR gate.

Referring to FIG. 9 and as an example of the learning process, a two input neural circuit is trained to function first as a Boolean AND logic gate and then as an OR logic gate is shown. This particular simulation is an example of an exhaustive supervised training session meaning the circuit is trained repetitively with every possible input/output combination until the output learns the desired expectation. As can be seen from the figure, the AND gate is implemented after two training cycles while the logical OR function requires three training cycles.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A neural circuit, comprising:
   at least one synapse circuit having an input and an output;
   wherein said synapse circuit further comprises a programmable voltage divider circuit having at least two elements across which a voltage drop may be established; and
   wherein at least one of said at least two elements comprises a memristor;
   at least one neuron circuit having an input and an output;
   wherein said outputs of said at least one synapse circuits are summed at said input of said at least one neuron circuit.

2. The apparatus of claim 1, wherein at least one of said at least two elements consists of either a resistive load or a semiconducting device.

3. The apparatus of claim 2 wherein said either resistive load or a semiconducting device are chosen so that:
   the voltage drop across said memristor is less than the voltage at which said memristor changes state, and
   said memristor's resistance range is maximized.

4. The apparatus of claim 1, wherein said memristor has a resistance range substantially between 200 ohms and 1000 ohms.

5. The apparatus of claim 1, wherein said at least one neuron circuit further comprises a global trainer, said global trainer further comprising means to detect whether the output of said neural circuit matches an expected output.

6. The apparatus of claim 5, wherein when said output of said neural circuit does not match an expected output, said global trainer sends a training select signal to all said at least one synapse circuits connected to said at least one neuron circuit.

7. The apparatus of claim 6, when for each of said at least one synapse circuit that receives said training select signal has its training select signal input and an input voltage input at a high voltage state, then a high voltage training pulse is delivered to said memristor of that synapse circuit.

8. The apparatus of claim 7, wherein said memristor may be trained to either its low or high resistance state according to the polarity of the voltage across it when said training is commenced.

9. The apparatus of claim 8 wherein said neural circuit may be trained to function as either an AND logic gate or an OR logic gate.

10. A neural circuit comprising:
    a synapse circuit, wherein said synapse circuit further comprises:
      a voltage input terminal being connected to a first end of a load element and to the gate of a PMOS transistor;
      the drain of said PMOS transistor being connected to a drain voltage source and the source of said PMOS transistor being connected to the drain of an NMOS transistor;
      the gate of said NMOS transistor being connected to a first end of a memristor and to a second end of said load element;
      the second end of said memristor being connected to a ground potential; and
      the source of said NMOS transistor being connected to the input of a neuron circuit,
    wherein said neuron circuit further comprises:
      a capacitor having a first end and a second end; and
      a buffer amplifier having an input and an output;
      wherein said first end of said capacitor is connected to said input of said buffer amplifier and said input of said neuron circuit; and said second end of said capacitor is connected to a ground potential.

11. The neural circuit of claim 10, wherein said load element consists of either a resistive load or a semiconducting device.

\* \* \* \* \*